(12) United States Patent
Petry et al.

(10) Patent No.: US 9,093,623 B2
(45) Date of Patent: Jul. 28, 2015

(54) CASTING COMPOSITION AS DIFFUSION BARRIER FOR WATER MOLECULES

(75) Inventors: Ralf Petry, Griesheim (DE); Holger Winkler, Darmstadt (DE); Tim Vosgroene, Ober-Ramstadt (DE)

(73) Assignee: Merck Patent GmbH, Darmstadt (DE)

(*) Notice: Subject to any disclaimer, the term of this patent is extended or adjusted under 35 U.S.C. 154(b) by 0 days.

(21) Appl. No.: 13/519,945

(22) PCT Filed: Dec. 1, 2010

(86) PCT No.: PCT/EP2010/007271
§ 371 (c)(1),
(2), (4) Date: Jun. 29, 2012

(87) PCT Pub. No.: WO2011/079900
PCT Pub. Date: Jul. 7, 2011

(65) Prior Publication Data
US 2012/0329184 A1    Dec. 27, 2012

(30) Foreign Application Priority Data

Dec. 30, 2009 (EP) .................................. 09016115

(51) Int. Cl.
*H01L 21/00* (2006.01)
*H01L 33/00* (2010.01)
*H01L 33/56* (2010.01)
*H01L 33/50* (2010.01)

(52) U.S. Cl.
CPC ............... *H01L 33/56* (2013.01); *H01L 33/501* (2013.01); *H01L 33/502* (2013.01); *H01L 2933/0041* (2013.01); *H01L 2933/0091* (2013.01)

(58) Field of Classification Search
CPC ....... H01L 33/50; H01L 33/58; H01L 33/501; H01L 33/502; H01L 2933/0041; H01L 2933/0091
USPC .................... 257/98–100, E21.502, E33.059, 257/E33.06, E33.074; 438/25–27, 127; 313/467, 486, 502, 512; 252/301.36, 252/301.4 R, 301.4 P
See application file for complete search history.

(56) References Cited

U.S. PATENT DOCUMENTS

| 5,300,558 A | * | 4/1994 | Kurisu et al. | ................. 524/707 |
| 6,066,861 A |   | 5/2000 | Hohn et al. |   |
| 6,841,888 B2 | * | 1/2005 | Yan et al. | ...................... 257/794 |

(Continued)

FOREIGN PATENT DOCUMENTS

| EP | 0 862 794 B1 | 9/1998 |
| JP | 11-500584 A | 1/1999 |

(Continued)

OTHER PUBLICATIONS

International Search Report of PCT/EP2010/007271 (Feb. 4, 2011).

(Continued)

*Primary Examiner* — Mary Wilczewski
*Assistant Examiner* — Erik T Peterson
(74) *Attorney, Agent, or Firm* — Millen, White, Zelano, Branigan, P.C.

(57) ABSTRACT

The invention relates to a casting composition based on a transparent epoxy or silicone resin (1), in particular for uses in an electroluminescent component (3), which preferably emits white light. The casting composition serves as diffusion barrier for moisture or water molecules through the use of glass and/or silica particles (2).

8 Claims, 3 Drawing Sheets

(56) References Cited

U.S. PATENT DOCUMENTS

Figure 1:
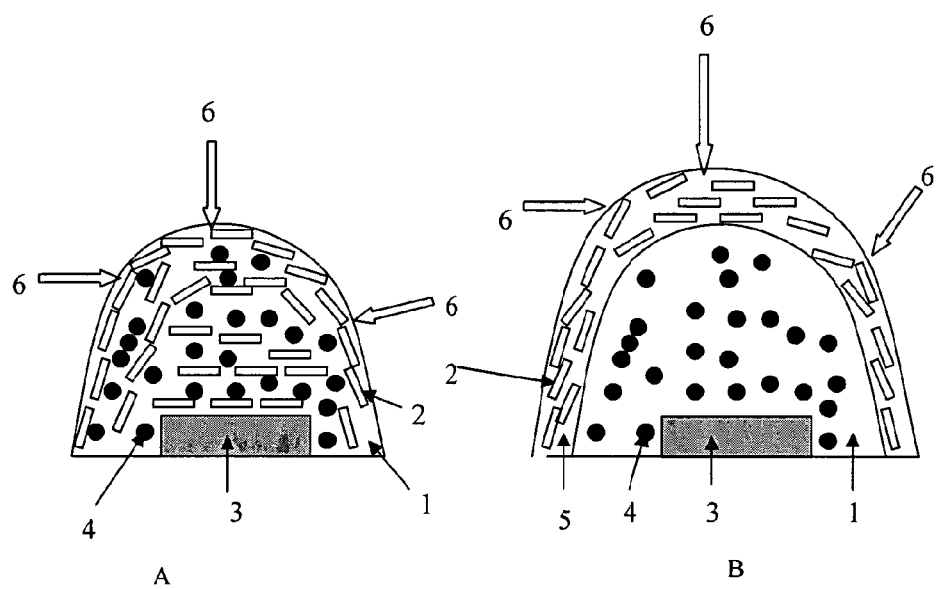

| | | | |
|---|---|---|---|
| 7,112,636 B2 * | 9/2006 | Okada | 525/533 |
| 2004/0130045 A1 * | 7/2004 | Bayless | 264/4.3 |
| 2004/0207998 A1 | 10/2004 | Suehiro et al. | |
| 2005/0158526 A1 * | 7/2005 | Ino et al. | 428/207 |
| 2005/0170180 A1 * | 8/2005 | Kawa | 428/402 |
| 2006/0012299 A1 * | 1/2006 | Suehiro et al. | 313/512 |
| 2007/0013057 A1 * | 1/2007 | Mazzochette | 257/723 |
| 2007/0125984 A1 * | 6/2007 | Tian et al. | 252/301.4 S |
| 2007/0241661 A1 * | 10/2007 | Yin | 313/502 |
| 2007/0299169 A1 * | 12/2007 | Ohira et al. | 524/100 |
| 2008/0003160 A1 * | 1/2008 | Kim et al. | 423/305 |
| 2008/0210961 A1 | 9/2008 | Lin et al. | |
| 2008/0308825 A1 * | 12/2008 | Chakraborty et al. | 257/98 |
| 2009/0001390 A1 * | 1/2009 | Yan et al. | 257/89 |
| 2009/0114938 A1 * | 5/2009 | Hsu et al. | 257/98 |
| 2009/0121180 A1 * | 5/2009 | Tsubokawa et al. | 252/182.3 |
| 2009/0130471 A1 * | 5/2009 | Saga | 428/477.7 |
| 2009/0261365 A1 * | 10/2009 | Brunner et al. | 257/98 |
| 2009/0261708 A1 * | 10/2009 | Moseri et al. | 313/501 |
| 2010/0143621 A1 * | 6/2010 | Mason et al. | 428/34.5 |
| 2012/0032578 A1 * | 2/2012 | Annen et al. | 313/483 |

FOREIGN PATENT DOCUMENTS

| | | |
|---|---|---|
| JP | 2003-176334 A | 6/2003 |
| JP | 2009-120437 A | 6/2009 |
| WO | WO2008040942 * | 4/2008 |

OTHER PUBLICATIONS

Japanese Office Action dated May 27, 2014 issued in corresponding Japanese Patent Application 2012-546375 (pp. 1-4).

English Translation of Japanese Office Action dated May 27, 2014 issued in corresponding Japanese Patent Application 2012-546375 (pp. 1-3).

English Translation Abstract of JP 11-500584 published Jan. 12, 1999.

English Translation Abstract of JP 2003-176334 published Jun. 24, 2003.

English Translation Abstract of JP 2009-120437 published Jun. 4, 2009.

* cited by examiner

CASTING COMPOSITION AS DIFFUSION BARRIER FOR WATER MOLECULES

The invention relates to a casting composition based on a transparent epoxy or silicone resin, in particular for uses in an electroluminescent component, which preferably emits white light, and to a process for the preparation of casting compositions of this type. The casting composition here serves as diffusion barrier for water molecules through the use of glass or silica flakes.

Commercial white pc-LEDs consist of a chip which emits in the blue spectral region and a coating consisting of silicone or epoxy resin, in which one or more phosphors are located.

The phosphors are frequently based on silicate, sulfidic, nitridic or oxynitridic materials. These materials have the property of decomposing in the presence of extremely small traces of moisture.

In the case of ortho-silicate phosphors, this applies, in particular, to green phosphors comprising high concentrations of barium. The moisture present in the air diffuses through the silicone or epoxy resin matrix to the phosphor particles. This has the consequence that, due to decomposition of the phosphor, the luminance thereof decreases and degrades over time. This is associated with a drop in the performance of the white pc-LED: firstly, the colour point of the LED changes. Furthermore, reflectors present in the LED of the chip and the electrical connections are destroyed corrosively by the hydrolysis products of sulfidic or (oxy)nitridic phosphors.

The costs arising due to the requisite replacement of the LED hinder rapid substitution of incandescent bulbs, halogen lamps and fluorescent lamps, which are inefficient and have a short lifetime, by white LEDs.

EP 862794 discloses a wavelength-converting casting composition which consists of epoxy resin and comprises inorganic phosphor pigments. In order to reduce agglomerate formation, the phosphor pigments may be provided with a silicone coating.

The object of the present invention is therefore to provide casting compositions which do not have one or more of the above-mentioned disadvantages.

Surprisingly, it has now been found that the decomposition of the phosphor, caused by traces of diffusing water, within the casting composition comprising a silicone or epoxy resin matrix can be prevented by the introduction of flake-form inorganic particles into the matrix. The flake-form particles, which consist of glass or silica, act as efficient diffusion barrier for the water molecules. Furthermore, the flake-form particles can be dispersed in the silicone or epoxy resin and can be applied directly to the phosphor coating of the LED as a separate diffusion barrier layer. (FIG. 1A or 1B)

The present invention thus relates to a casting composition based on at least one transparent silicone or epoxy resin comprising inorganic phosphor particles and glass and/or silica particles, preferably in flake form, and a UV or blue light-emitting diode.

In a preferred embodiment, the glass or silica particles and the phosphor particles are homogeneously distributed in the casting composition (see FIG. 1A)

In a further preferred embodiment, the flake-form glass or silica particles are dispersed and aligned in a plane-parallel manner in the casting composition and are arranged directly on an additional casting composition which comprises exclusively the phosphor particles as a separate diffusion barrier layer (see FIG. 1B)

The glass and silica particles preferably have a diameter of 5 to 20 µm and a thickness of 0.1 to 5 µm.

The average particle diameter $d_{50}$ of the phosphor particles is preferably <20 µm.

The effect of the flake-form glass and silica particles is based on the fact that the diffusion pathway of the water molecules is blocked in the casting composition comprising silicone or epoxy resin matrix. This occurs through the plane-parallel alignment of the particles in certain domains and through the offset arrangement of the flakes in the vertical direction. (see FIG. 2)

Owing to the fact that glass or silica particles have approximately the refractive index of the silicone or epoxy resin matrix in the range n=1.4-1.5, the optical properties of the white LED are not adversely affected. Due to the slightly scattering properties of the flake-form particles (effect of the particle edges), the homogeneity of the luminance and colour temperature is improved over the angle range of the white LED.

In order to improve the dispersibility of the flake-form glass and/or silica particles within the epoxy or silicone resin, the particles may be surface-coated. The flake-form particles are then coated with silicones/silanes by wet-chemical methods or by vapour deposition. These organosilicon compounds react with the surface OH groups of the flake-form particles. The desired hydrophobicity of the particles, structure of the oligomer/polymer chains and the coupling (physical and/or chemical) to the resin is controlled by modification of the organic chains of the silicon compounds.

The phosphor particles preferably consist of at least one of the following phosphor materials:

(Y, Gd, Lu, Sc, Sm, Tb)$_3$(Al, Ga)$_5$O$_{12}$:Ce (with or without Pr), (Ca, Sr, Ba)$_2$SiO$_4$:Eu, YSiO$_2$N:Ce, Y$_2$Si$_3$O$_3$N$_4$:Ce, Gd$_2$Si$_3$O$_3$N$_4$:Ce, (Y,Gd,Tb,Lu)$_3$Al$_{5-x}$Si$_x$O$_{12-x}$N$_x$:Ce, BaMgAl$_{10}$O$_{17}$:Eu, SrAl$_2$O$_4$:Eu, Sr$_4$Al$_{14}$O$_{25}$:Eu, (Ca,Sr,Ba)Si$_2$N$_2$O$_2$:Eu, SrSiAl$_2$O$_3$N$_2$:Eu, (Ca,Sr,Ba)$_2$Si$_5$N$_8$:Eu, CaAlSiN$_3$:Eu, zinc alkaline earth metal orthosilicates, copper alkaline earth metal orthosilicates, iron alkaline earth metal orthosilicates, molybdates, tungstates, vanadates, group III nitrides, oxides, in each case individually or mixtures thereof with one or more activator ions, such as Ce, Eu, Mn, Cr and/or Bi.

Particularly preferred inorganic phosphor particles for the production of white-luminescent opto-electronic components are orthosilicates.

The starting materials for the production of the phosphor particle consist of the base material (for example salt solutions of yttrium, aluminium, gadolinium, etc.) and at least one dopant (for example cerium). Suitable starting materials are inorganic and/or organic substances, such as nitrates, halides, carbonates, hydrogencarbonates, phosphates, carboxylates, alcoholates, acetates, oxalates, sulfates, organometallic compounds, hydroxides and/or oxides of the metals, semimetals, transition metals and/or rare earths, which are dissolved and/or suspended in inorganic and/or organic liquids. Preference is given to the use of mixed nitrate solutions, chloride or hydroxide solutions which comprise the corresponding elements in the requisite stoichiometric ratio.

The object in accordance with the invention is furthermore achieved by a process for the preparation of a casting composition based on at least one transparent silicone or epoxy resin comprising inorganic phosphor particles and glass and/or silica particles and a UV or blue light-emitting diode, characterised by the process steps of:

a) homogeneous mixing of inorganic phosphor particles with pulverulent glass and/or silica particles
b) dispersal of the mixture of phosphors and glass or silica particles with the transparent silicone or epoxy resin.

c) coating of the blue light-emitting diode with silicone or epoxy resin which comprises the phosphor and the glass and/or silica particles.

d) curing of the coating.

The curing of the coating is carried out at temperatures between 120 and 180° C., preferably at 150° C.

The production of the glass and silica particles is carried out by conventional processes via a belt process from the corresponding alkali metal salts (for example from a potassium or sodium water-glass solution for silica). The production process is described in detail in EP 763573, EP 608388 and DE 19618564.

The present invention furthermore relates to a process for the preparation of a casting composition based on at least one transparent silicone or epoxy resin comprising inorganic phosphor particles and glass and/or silica particles and a UV or blue light-emitting diode, characterised by the process steps of:
  a) dispersal of the inorganic phosphor particles with silicone or epoxy resin.
  b) coating of the light-emitting diode with the mixture of phosphor particles and silicone or epoxy resin.
  c) curing of the coating.
  d) dispersal of the glass and/or silica particles in silicone or epoxy resin.
  e) production of a diffusion barrier layer by coating the cured phosphor coating.
  f) curing of the diffusion barrier layer.

It is furthermore preferred for the flake-form glass or silica particles to be surface-coated with organosilicon compounds (such as silicones or silanes) by wet-chemical methods or by vapour deposition. As already mentioned, the coupling to the epoxy or silicone resin is improved by this coating.

Light-scattering particles, so-called diffusers (such as, for example, $CaF_2$), may additionally be added to the casting composition. This advantageously enables the colour impression and the emission characteristics of the semiconductor component to be optimised further.

In addition, the casting composition may also comprise adhesion promoters, hydrophobicising agents, processing assistants and/or thixotropic agents. Thixotropic agents which can be used are, for example, pyrogenic silicic acid. The thixotropic agent serves for thickening of the epoxy resin in order to prevent sedimentation of the phosphor particles. Suitable processing assistants are, for example, glycol ethers.

Adhesion promoters which can be employed are, for example, functional alkoxysiloxanes which improve the adhesion between phosphor particles and resin.

Hydrophobicising agents which can be employed are, for example, liquid silicone wax, which likewise serves for modification of the phosphor particle surface.

The UV or blue light-emitting diode according to the invention is a light source comprising a luminescent indium aluminium gallium nitride, in particular of the formula $In_iGa_jAl_kN$, where $0 \leq i$, $0 \leq j$, $0 \leq k$, and $i+j+k=1$.

Possible forms of light sources of this type are known to the person skilled in the art. These may be light-emitting LED chips of various structure.

The following examples are intended to clarify the present invention. However, they should in no way be regarded as limiting. All compounds or components which can be used in the preparations are either known and commercially available or can be synthesised by known methods. The temperatures indicated in the examples are always in ° C. It furthermore goes without saying that, both in the description and in the examples, the added amounts of the components in the compositions always add up to a total of 100%. Percentage data given should always be regarded in the given context. However, they usually always relate to the weight of the part amount or total amount indicated.

EXAMPLES

Example 1

Coating of Flake-Form Glass or Silica Particles with Functional Groups

1. A) Silanisation for Epoxy Polymers:

100 g of the silica or glass particles are suspended in 1350 ml of deionised water with vigorous stirring. The pH of the suspension is adjusted to pH=6.5 using 5 wt % of $H_2SO_4$, and the suspension is heated to 75° C. 4.0 g of a 1:1 mixture of Silquest A-186[beta-(3,4-epoxycyclohexyl)ethyltrimethoxysilane]and Silquest A-1310 [gamma-isocyanatopropyltriethoxysilane] are subsequently metered into the suspension over the course of 60 min with moderate stirring. When the addition is complete, the mixture is subsequently stirred for 15 min in order to complete the coupling of the silanes to the surface. The pH is corrected to 6.5 by means of 5 wt % $H_2SO_4$. The suspension is subsequently filtered, and the filter cake is washed with deionised water until salt-free. The drying is carried out at 130° C. for 20 h. The powder obtained in this way is then sieved by means of a 40 μm sieve.

1. B) Silanisation for Silicone Resin Coupling:

100 g of the silica or glass particles are suspended in 1350 ml of deionised water with vigorous stirring. The pH of the suspension is adjusted to pH=6.5 using 5 wt % $H_2SO_4$, and the suspension is heated to 75° C. 6.0 g of a 1:2 mixture of Silquest A-1110 [gamma-aminopropyltrimethoxysilane] and Silquest A-1524 [gamma-ureapropyltrimethoxysilane] are subsequently metered into the suspension over the course of 75 min with moderate stirring. When the addition is complete, the mixture is subsequently stirred for 15 min in order to complete the coupling of the silanes to the surface. The pH is corrected to 6.5 by means of 5 wt % $H_2SO_4$.

The suspension is subsequently filtered, and the filter cake is washed with deionised water until salt-free. The drying is carried out at 140° C. for 20 h. The powder obtained in this way is then sieved by means of a 40 μm sieve.

1. C) Silanisation with a Vinylsilane for Silicone Resin Coupling:

100 g of the silica or glass particles are suspended in 1350 ml of deionised water with vigorous stirring. The pH of the suspension is adjusted to pH=6.8 using 5 wt % $H_2SO_4$, and the suspension is heated to 75° C. 6.0 g of a 1:2 mixture of Silquest A-174[gamma-methacryloxypropyltrimethoxysilane] and Silquest A-151[vinyltriethoxysilane] are subsequently metered into the suspension over the course of 90 min with moderate stirring. When the addition is complete, the mixture is subsequently stirred for 15 min in order to complete the coupling of the silanes to the surface. The pH is corrected to 6.5 by means of 5 wt % $H_2SO_4$.

The suspension is subsequently filtered, and the filter cake is washed with deionised water until salt-free. The drying is carried out at 140° C. for 20 h. The powder obtained in this way is then sieved by means of a 40 μm sieve.

Example 2

Production of an LED

A) Mixture of Phosphor with Flake-Form Particles

The following mixtures are prepared in a Speedmixer® (speed 3000 rpm, duration: 5 min, room temperature):

50 ml of each of the two resin components JCR 6122 a and b are admixed with 4% by weight of one of the green orthosilicate phosphors and 2% of uncoated glass or silica particles or the flake-form particles which have been compatibilised in accordance with Example 1A, B, or C. The flake-form particles have an average diameter of 5 μm to 20 μm and a thickness distribution from 0.1 μm to 5 μm. The two resin mixtures are combined, stirred and degassed. 10 ml are then introduced into the storage vessel of a jet dispenser or screw metering valve dispenser. Bonded COB (chip on board) crude LED packages are placed beneath the dispensing valve. Glob tops of the resin mixture are then placed dropwise on the chips of the crude LED packages using the dispenser. These coated LEDs are conditioned in a drying cabinet at 150° C. for 1 hour, during which the resin (=casting composition) cures.

B) Separate Diffusion Barrier Layer

The following mixtures are prepared in a Speedmixer® (speed 3000 rpm, duration: 5 min, room temperature):

50 ml of each of the two resin components JCR 6122 a and b are admixed with 4% by weight of a green orthosilicate phosphor. The two resin mixtures are combined, stirred and degassed. 10 ml are then introduced into the storage vessel of a jet dispenser or screw metering valve dispenser. Bonded COB (chip on board) crude LED packages are placed beneath the dispensing valve. Glob tops of the resin mixture are then placed dropwise on the chips of the crude LED packages using the dispenser. These coated LEDs are conditioned in a drying cabinet at 150° C. for 1 hour, during which the resin (=casting composition) cures.

50 ml of the two resin components JCR 6122 a and b are subsequently again mixed with 4% by weight of the uncoated glass or silica particles or the flake-form glass and/or silica particles which have been compatibilised in accordance with Example 1A, B, or C. The two resin mixtures are combined, stirred and degassed. 10 ml are then introduced into the storage vessel of a jet dispenser or screw metering valve dispenser. The coated LEDs are placed beneath the dispensing valve. The diffusion barrier layers consisting of the resin mixture and the flake-form particles are then applied to the coated LEDs using the dispenser. These coated LEDs are then conditioned in a drying cabinet at 150° C. for 1 hour, during which the resin of the diffusion barrier layer cures.

FIGURES

The invention will be explained in greater detail below with reference to a number of illustrative embodiments, in which:

FIG. 1 shows a homogeneous distribution of the glass or silica flakes in the silicone or epoxy resin matrix. 1: silicone/epoxy resin, 2: glass or silica flakes, 3: LED chip, 4: phosphor particles; B) separate diffusion barrier layer; 5: diffusion barrier layer consisting of silicone/epoxy resin matrix which comprises only the flake-form particles; 6: water diffusing in.

Figure 2:
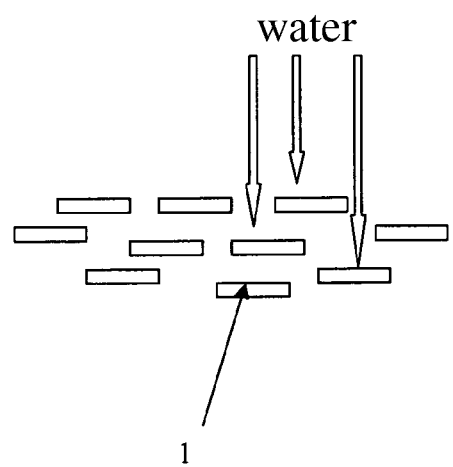

FIG. 2: 1: glass or silica particles. The flake-form particles are aligned parallel and overlap in the vertical direction, effectively preventing the diffusion of water.

Figure 3:
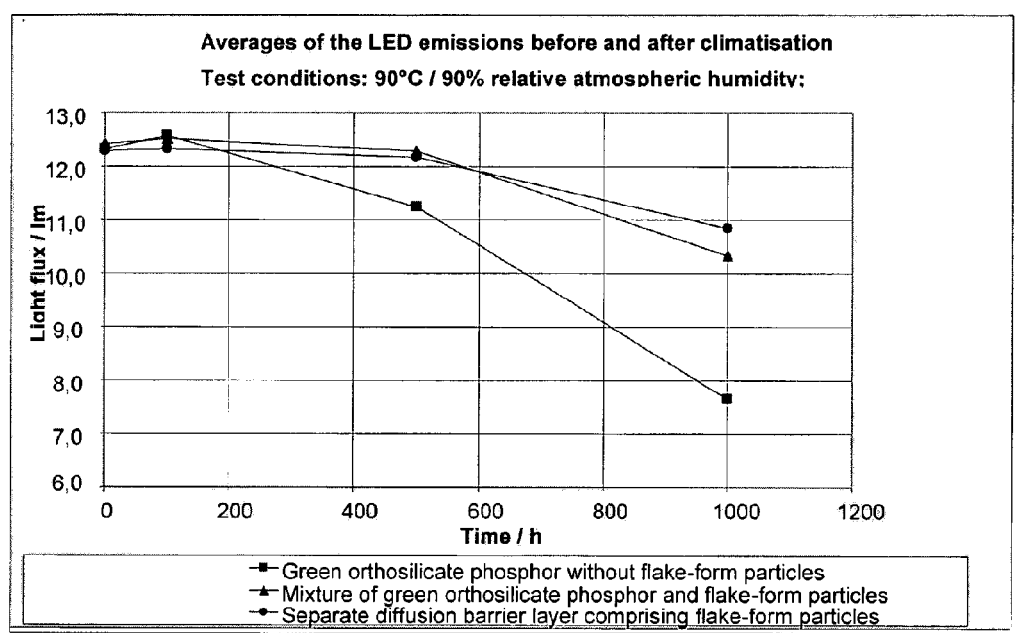

FIG. 3: A: average of the measurements of the light flux of 50 LEDs which have a separate water diffusion barrier layer.

B: average of the measurements of the light flux of 50 LEDs which have a water diffusion barrier. The green orthosilicate phosphor has been mixed with flake-form particles here.

C: average of the measurements of the light flux of 50 LEDs which have no water diffusion barrier.

The invention claimed is:

1. A process for the preparation of a light emitting device comprising a casting composition based on at least one transparent silicone resin comprising inorganic phosphor particles and flake-form glass and/or flake-form silica particles and a UV or blue light-emitting diode, said process comprising:
   a) dispersing the inorganic phosphor particles within silicone resin,
   b) coating of the light-emitting diode with the resultant mixture of phosphor particles and silicone resin,
   c) curing the coating
   d) dispersing the flake-form glass or flake-form silica particles in silicone resin to form a diffusion barrier composition,
   e) producing a diffusion barrier layer by coating the cured phosphor coating with said diffusion barrier composition, and
   f) curing of the diffusion barrier layer.

2. A process according to claim 1 wherein said flake-form glass and/or flake-form silica particles have a diameter of 5 to 20 μtm and a thickness of 0.1 to 5 82 m.

3. A process according to claim 1, wherein the inorganic phosphor particles are:
(Y, Gd, Lu, Sc, Sm, Tb)$_3$ (Al, Ga)$_5$O$_{12}$:Ce (with or without Pr), (Ca, Sr Ba)$_2$SiO$_4$:Eu, YSiO$_2$N:Ce, Y$_2$Si$_3$O$_3$N$_4$:Ce, Gd$_2$Si$_3$O$_3$N$_4$:Ce, (Y,Gd,Tb,Lu)$_3$Al$_{5-x}$Si$_x$O$_{12-x}$N$_x$:Ce, BaMgAl$_{10}$O$_{17}$:Eu, SrAl$_2$O$_4$:Eu, Sr$_4$Al$_{14}$O$_{25}$:Eu, (Ca,Sr,Ba)Si$_2$N$_2$O$_2$:Eu, SrSiAl$_2$O$_3$N$_2$:Eu, (Ca,Sr,Ba)$_2$Si$_5$N$_8$:Eu, CaAlSiN$_3$:Eu, a zinc alkaline earth metal orthosilicate, a copper alkaline earth metal orthosilicate, an iron alkaline earth metal orthosilicate, a molybdate, a tungstate, a vanadate, a group III nitride, a group III oxide, in each case individually or mixtures thereof with one or more activator ion, that is Ce, Eu, Mn, Cr or Bi.

4. A process according to claim 1, wherein the flake-form glass and/or flake-form silica particles are surface-coated with organosilicon compounds.

5. A process according to claim 1, wherein the inorganic phosphor particles are :
(Y, Gd, Lu, Sc, Sm, Tb)$_3$ (Al, Ga)$_5$O$_{12}$:Ce (with or without Pr), (Ca, Sr Ba)$_2$SiO$_4$:Eu, YSiO$_2$N:Ce, Y$_2$Si$_3$O$_3$N$_4$:Ce, Gd$_2$Si$_3$O$_3$N$_4$:Ce, BaMgAl$_{10}$O$_{17}$:Eu, SrAl$_2$O$_4$:Eu, Sr$_4$Al$_{14}$O$_{25}$:Eu, (Ca,Sr,Ba)Si$_2$N$_2$O$_2$:Eu, SrSiAl$_2$O$_3$N$_2$:Eu, (Ca,Sr,Ba)$_2$Si$_5$N$_8$:Eu, or CaAlSiN$_3$:Eu.

6. A process according to claim 1, wherein the average particle diameter $d_{50}$ of the phosphor particles is <20 μm.

7. A process according to claim 1, wherein said flake-form particles are arranged in an offset manner in the vertical direction with respect to the neighbouring particle.

8. A light emitting device prepared by a process according to claim 1.

* * * * *